(12) United States Patent
Godaiin

(10) Patent No.: US 8,648,943 B2
(45) Date of Patent: Feb. 11, 2014

(54) SOLID-STATE IMAGING DEVICE AND CAMERA MODULE

(75) Inventor: Hironori Godaiin, Tokyo (JP)

(73) Assignee: Sony Corporation, Tokyo (JP)

( * ) Notice: Subject to any disclaimer, the term of this patent is extended or adjusted under 35 U.S.C. 154(b) by 100 days.

(21) Appl. No.: 12/923,977

(22) Filed: Oct. 19, 2010

(65) Prior Publication Data

US 2011/0037854 A1 Feb. 17, 2011

Related U.S. Application Data

(62) Division of application No. 12/153,041, filed on May 13, 2008.

(30) Foreign Application Priority Data

Jun. 28, 2007 (JP) ................................. 2007-171008

(51) Int. Cl.
*H04N 5/335* (2011.01)
*H04N 5/33* (2006.01)

(52) U.S. Cl.
USPC ............ 348/272; 348/277; 348/294; 348/164

(58) Field of Classification Search
None
See application file for complete search history.

(56) References Cited

U.S. PATENT DOCUMENTS

| 7,688,377 | B2 * | 3/2010 | Matsuda et al. ............... 348/340 |
| 2005/0051860 | A1 * | 3/2005 | Takeuchi et al. ............... 257/436 |
| 2007/0188635 | A1 * | 8/2007 | Yamaguchi et al. .......... 348/272 |
| 2007/0237888 | A1 * | 10/2007 | Liu et al. ......................... 427/58 |
| 2007/0285540 | A1 * | 12/2007 | Kwon et al. ................... 348/272 |
| 2008/0074520 | A1 * | 3/2008 | Matsuda et al. .............. 348/294 |
| 2009/0026563 | A1 * | 1/2009 | Katsuno et al. ............... 257/432 |
| 2012/0077300 | A1 * | 3/2012 | Hashimoto ..................... 438/69 |

FOREIGN PATENT DOCUMENTS

| JP | 02-084766 A | 3/1990 |
| JP | 2005-294647 A | 10/2005 |
| JP | 2006-120787 A | 5/2006 |
| JP | 2006-128433 A | 5/2006 |
| JP | 2006-190958 | 7/2006 |
| JP | 2006-295125 A | 10/2006 |

OTHER PUBLICATIONS

Japanese Office Action issued May 22, 2012 for corresponding Japanese Application No. 2007-171008.

* cited by examiner

*Primary Examiner* — Lin Ye
*Assistant Examiner* — John H Morehead, III
(74) *Attorney, Agent, or Firm* — Rader, Fishman & Grauer PLLC

(57) ABSTRACT

A solid-state imaging device is provided. The solid-state imaging device includes a plurality of arrayed pixels, an optical inner filter layer, and a light-blocking side wall. The plurality of arrayed pixels each includes a photoelectric conversion portion and a pixel transistor. The optical inner filter layer is provided for blocking infrared light and formed facing to a light-receiving surface of the photoelectric conversion portion of a desired pixel among the arrayed pixels. The light-blocking side wall is formed on a lateral wall of the optical inner filter layer.

20 Claims, 15 Drawing Sheets

SOLID-STATE IMAGING DEVICE AND CAMERA MODULE

CROSS REFERENCES TO RELATED APPLICATIONS

This is a Divisional Application of the patent application Ser. No. 12/153,041, filed May 13, 2008, which claims priority from Japanese Patent Application JP 2007-171008 filed in the Japanese Patent Office on Jun. 28, 2007, the entire contents of which being incorporated herein by reference.

BACKGROUND OF THE INVENTION

1. Field of the Invention

The present invention relates to a solid-state imaging device, particularly, a solid-state imaging device, for example, a MOS image sensor in which a photoelectric conversion portion and a pixel transistor are included in a pixel. In addition, the present invention relates to a camera module including such a solid-state imaging device.

2. Description of the Related Art

Solid-state imaging devices can be roughly classified into charge transfer solid-state imaging devices typified by CCD image sensors and amplified solid-state imaging devices typified by CMOS image sensors. In comparison with the CMOS image sensor, the CCD image sensor may need a power supply voltage higher than that of the CMOS image sensor, because the CCD image sensor may require a high driving voltage for the transfer of a signal electric charge.

Therefore, CMOS image sensors having advantages over the CCD image sensors in terms of lower power source supply, power consumption, and the like, compared with those of the CCD image sensors are mounted as the solid-state imaging device on mobile devices, such as camera cell phones and personal digital assistants (PDFs), which have been used in large numbers in recent years.

The solid-state imaging device used in any mobile device or the like has a reduced area per pixel along with miniaturization and high-resolution. In addition, the area of a photodiode to be provided as a photoelectric conversion portion is reduced along with a decrease in area of the pixel. Thus, it may result in a decrease in sensitivity or the like. Therefore, for example, for allowing a user to take a bright image of a dark subject, a solid-state imaging device having a unit pixel matrix including pixels on which infrared light (IR) is incident and other color pixels with optical inner filter layers for blocking infrared light (or inner-layer IR cut filter layers) has been known in the art (see Japanese Unexamined Patent Application Publication No. 2006-190958).

FIG. 1 illustrates a CMOS image sensor without a filter layer for blocking infrared light, while FIG. 2 illustrates a CMOS image sensor provided with a filter layer for blocking infrared light. In FIGS. 1 and 2, a pixel is schematically represented only by a photodiode PD while a pixel transistor is omitted for making the configuration of the CMOS image sensor clearly understandable.

The CMOS image sensor 1 as illustrated in FIG. 1 includes an imaging area formed of a plurality of pixels provided in a two-dimensional array. Each of the pixels has a photodiode (PD) 3 as a photoelectric conversion portion and a plurality of pixel transistors (MOS transistors, not shown) on the principal surface of a semiconductor substrate 2. A plurality of wiring layers 6 with a plurality of layered lines 5 through an insulating interlayer 4 is formed on the principal surface of the pixel-formed semiconductor substrate 2. Furthermore, a color filter 7 and an on-chip micro lens 8 are formed above the plurality of wiring layers 6 through a planarizing layer (not shown).

The CMOS image sensor 11 as illustrated in FIG. 2 includes an imaging area formed of a plurality of pixels provided in a two-dimensional array. Each of the pixels has a photodiode (PD) 3 as a photoelectric conversion portion and a plurality of pixel transistors (MOS transistors, not shown) on the principal surface of a semiconductor substrate 2. A plurality of wiring layers 6 with a plurality of layered lines 5 through an insulating interlayer 4 is formed on the principal surface of the pixel-formed semiconductor substrate 2. Furthermore, an optical inner filter layer (inner-layer IR cut filter layer) 12 is formed above the plurality of wiring layers 6 for a pixel on which the incidence of infrared light should be blocked. In other words, the optical inner filter layer 12 is formed above each of the pixels of red (R), green (G), and blue (B) but no optical inner filter layer 12 is formed above one pixel (that is, IR pixel). A buried layer 13 is formed on an area on which no optical inner filter layer 12 is formed and a color filter 7 and an on-chip micro lens 8 are then formed through a planarizing layer (not shown). Here, a unit pixel matrix includes four pixels, that is, the R, G, and B pixels and the IR pixel. The color filter for the IR pixel is formed of a filter transmitting visible light and infrared light.

The CMOS image sensor 11 includes the IR pixel which positively uses infrared light, so that the sensitivity thereof can be enhanced to allow a user to take a bright image with suitable color tone, for example, when the user wishes to take a bright image of a dark subject.

SUMMARY OF THE INVENTION

As shown in FIG. 2, the above-described CMOS image sensor including the optical inner filter layer 12 in the layer under the color filter 7 has a larger distance H1 from the light-receiving surface of the photodiode 3 to the on-chip micro lens 8, compared with the distance H2 of the CMOS image sensor 1 without the optical inner filter layer 12 as shown in FIG. 1. The larger the distance H1 becomes, the more the collection of light by the on-chip micro lens 8 becomes insufficient. Thus, color light, particularly oblique light, passed through the color filter 7 and incident on the target pixel may enter adjacent pixels of other colors. Therefore, the color mixture may occur and the property of the device, that is, color sensitivity, may decrease.

It is desirable to provide a solid-state imaging device having an optical inner filter layer for blocking infrared light while suppressing the occurrence of a color mixture and also provide a camera module including such a solid-state imaging device.

According to an embodiment of the present invention, there is provided a solid-state imaging device including a plurality of arrayed pixels, an optical inner filter layer, and a light-blocking side wall. The arrayed pixels each include a photoelectric conversion portion and a pixel transistor. The optical inner filter layer is provided for blocking infrared light and formed facing to a light-receiving surface of the photoelectric conversion portion of a desired pixel among the arrayed pixels. The light-blocking side wall is formed on the lateral wall of the optical inner filter layer.

According to another embodiment of the present invention, there is provided a camera module including an optical lens system and a solid-state imaging device. The solid-state imaging device includes a plurality of arrayed pixels, an optical inner filter layer, and a light-blocking side wall. The arrayed pixels each include a photoelectric conversion portion and a pixel transistor. The optical inner filter layer is provided for blocking infrared light and formed facing to a light-receiving surface of the photoelectric conversion portion of a desired pixel among the arrayed pixels. The light-blocking side wall is formed on the lateral wall of the optical inner filter layer.

The solid-state imaging device according to the embodiment of the present invention includes a side wall with a light-blocking effect formed on a lateral wall of the optical inner filter layer. Therefore, oblique light incident on each pixel is blocked by the side wall of the optical inner filter layer and suppressed so as not to enter adjacent pixels.

The camera module according to the embodiment of the present invention includes the solid-state imaging device having a side wall with a light-blocking effect. The side wall is formed on a lateral wall of the optical inner filter layer. Therefore, oblique light incident on each pixel is blocked by the side wall of the optical inner filter layer and suppressed so as not to enter adjacent pixels.

According to the solid-state imaging device of the embodiment of the present invention, oblique incident light is blocked by the side wall of the optical inner filter layer and suppressed so as not to enter adjacent pixels. As a result, the occurrence of a color mixture can be suppressed. The camera module according to the embodiment of the present invention includes the above solid-state imaging device, so that the occurrence of a color mixture can be suppressed while obtaining high quality images.

BRIEF DESCRIPTION OF THE DRAWINGS

FIGS. 12A, 12B, and 12C illustrate the respective steps of the process.

FIGS. 13D, 13E, and 13F illustrate the respective steps of the process, which are subsequent to the steps of FIG. 12.

FIGS. 14G, 14H, and 14I illustrate the respective steps of the process, which are subsequent to the steps of FIG. 13.

DESCRIPTION OF THE PREFERRED EMBODIMENTS

Hereinafter, embodiments of the present invention will be described with reference to the attached drawings.

Figure 1:
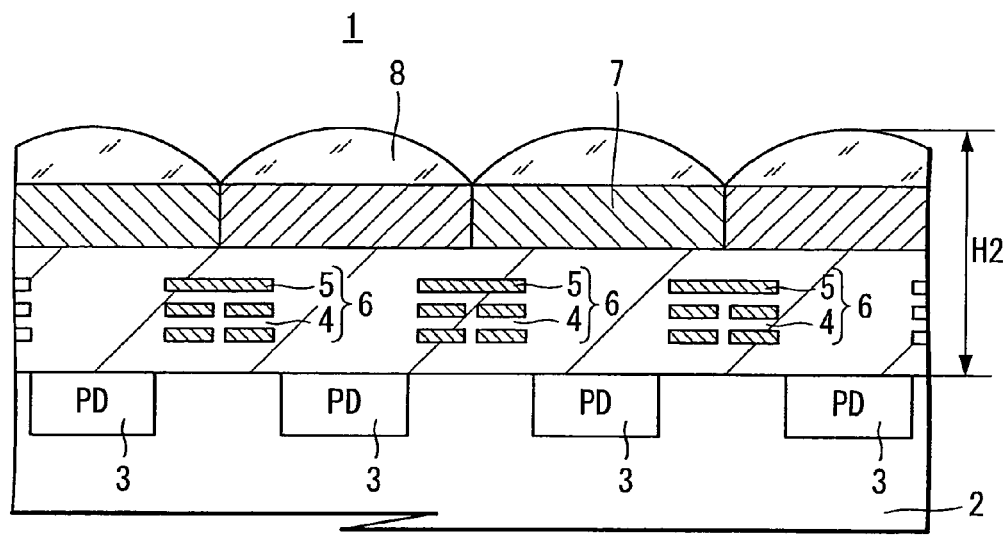
FIG. 1 is a schematic diagram illustrating main parts of an example of a CMOS solid-state imaging device according to the related-art without an optical inner filter layer that blocks infrared light.
Figure 2:
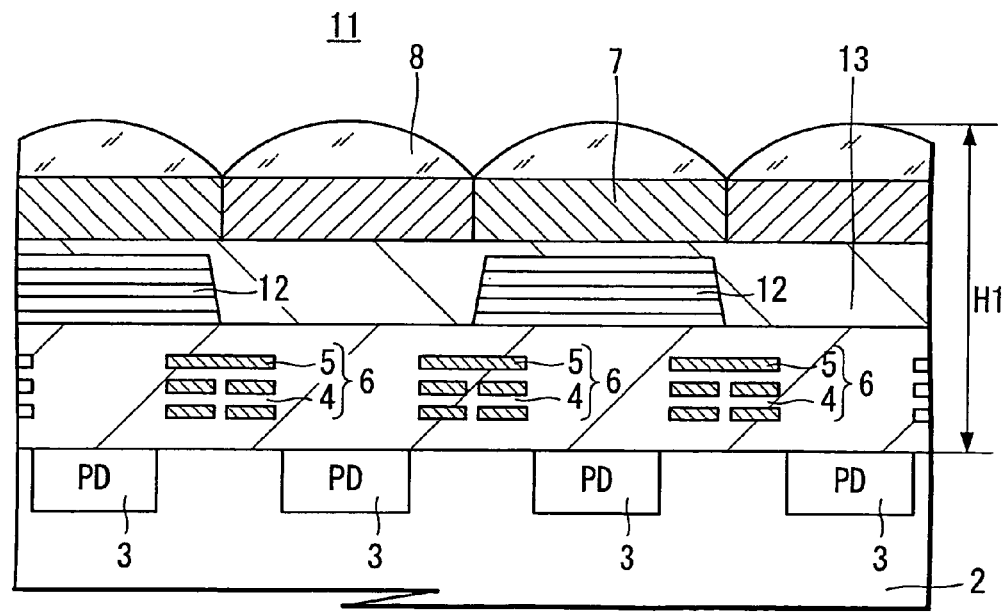
FIG. 2 is a schematic diagram illustrating main parts of an example of a CMOS solid-state imaging device according to the related-art provided with an optical inner filter layer that blocks infrared light.
Figure 3:
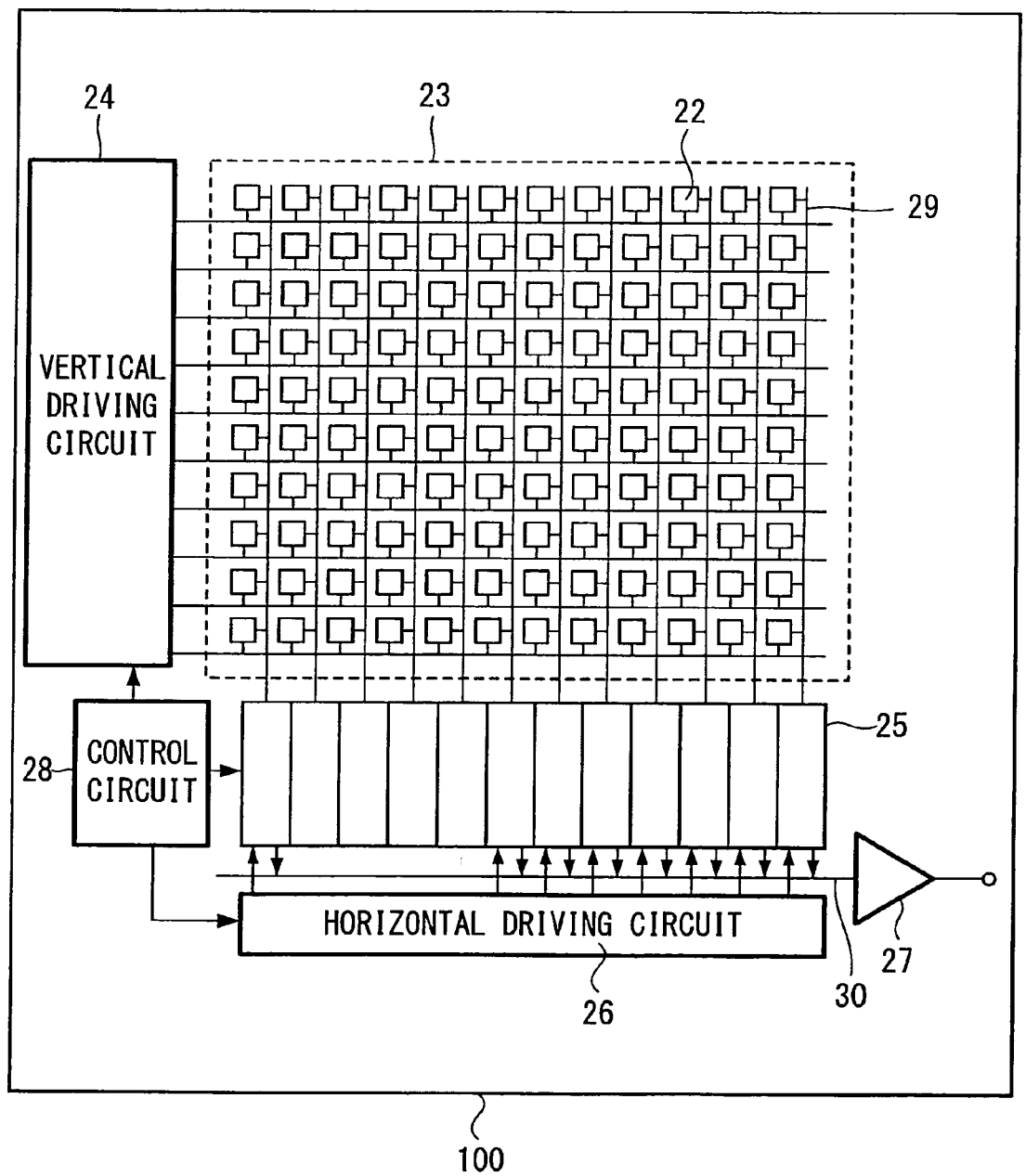
FIG. 3 is a schematic diagram illustrating the whole configuration of a solid-state imaging device in accordance with an embodiment of the present invention.

FIG. 3 is a schematic diagram of the whole configuration of a CMOS solid-state imaging device (image sensor) as a solid-state imaging device in accordance with an embodiment of the present invention. The solid-state imaging device 21 of the present embodiment includes an imaging area 23; and, as peripheral circuits, a vertical driving circuit 24; a column-signal processing circuit 25; a horizontal driving circuit 26, an output circuit 27; a control circuit 28; and the like, on a semiconductor substrate 100, such as a silicon substrate. Here, on the imaging area 23, a plurality of pixels 22 with their respective photoelectric conversion portions is regularly-arranged in a two dimensional array.

The control circuit 28 generates signals (e.g., a clock signal and a control signal) used as standards for the operation of the vertical driving circuit 24, the column-signal processing circuit 25, the horizontal driving circuit 26, and the like, on the basis of a vertical synchronizing signal, a horizontal synchronizing signal, and a master clock. The generated signals are input to the vertical driving circuit 24, the column-signal processing circuit 25, the horizontal driving circuit 26, and the like.

The vertical driving circuit 24 includes, for example, a shift register and selectively scans each pixel 22 per row on the imaging area 23 in the vertical direction in succession. A pixel signal based on a signal electric charge generated in response to the amount of light received on a photoelectric conversion portion (photodiode) 31 of each pixel is supplied to a column-signal processing circuit 25 through a vertical signal line 29.

The column-signal processing circuit 25 is arranged for, for example, each column of the pixels 22. Signals output from the pixels 22 in one row are subjected to signal processing, such as CDS for removing a noise (i.e., a fixed pattern noise inherent in the pixel 22) and signal amplification. A horizontal selection switch (not shown) is connected between an output stage of the column-signal processing circuit 25 and a horizontal signal line 30.

The horizontal driving circuit 26 includes, for example, a sift register. It selects each of the column-signal processing circuits 25 in order by sequentially outputting horizontal scanning pulses. Pixel signals from the respective column-signal processing circuits 25 are output to the horizontal signal line 30, respectively. The output circuit 27 carries out signal processing on signals sequentially supplied from the respective column-signal processing circuits 25 through the horizontal signal line 30.

Figure 4:
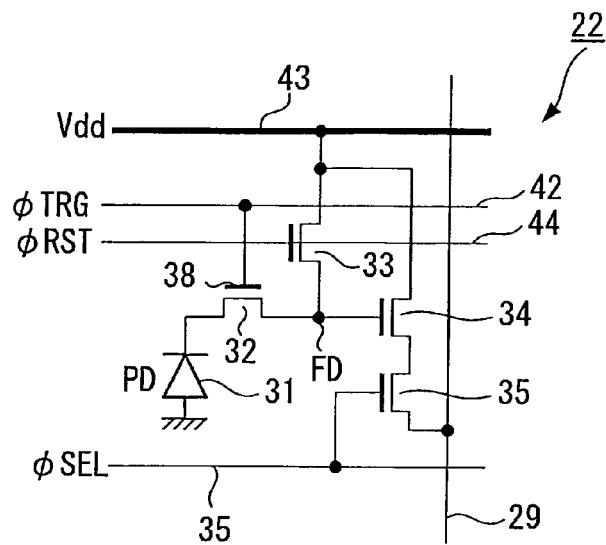
FIG. 4 is a circuit diagram illustrating an equivalent circuit of an exemplified unit pixel.

FIG. 4 illustrates an example of an equivalent circuit of the above pixel 22. The pixel 22 includes: a photoelectric conversion portion such as a photodiode 31; and a plurality of pixel transistors, that is, MOS transistors. The plurality of MOS transistors includes, for example, a transfer transistor 32, a reset transistor 33, an amplification transistor 34, and a selection transistor 35.

The photodiode 31 carries out the photoelectric conversion of converting light into electric charges (here, electrons) the amount of which depends on the amount of light received. The cathode of the photodiode 31 is connected to the gate of the amplification transistor 34 through the transfer transistor 32. A node electrically connecting to the gate of the amplification transistor 34 is referred to as a floating diffusion part FD. The floating diffusion part FD is formed at the drain of the transfer transistor 32.

The transfer transistor 32 is connected between the cathode of the photodiode 31 and the floating diffusion part FD. The gate of the transfer transistor 32 is turned ON when a transfer pulse φTRG is applied to the transfer transistor 32 through a transfer line 42. As a result, the electric charge of the photodiode 31 is transferred to the floating diffusion part FD.

The drain of the reset transistor 33 is connected to a pixel power (Vdd) line 43 and the source thereof is connected to the floating diffusion part FD. The reset transistor 33 is turned ON when a reset pulse φRST is applied to the gate thereof through a reset line 44. In this ON state, the floating diffusion part FD is reset by draining the electric charges of the floating diffusion part FD to a pixel power line 43 before the transfer of a signal charge from the photodiode 31 to the floating diffusion part FD.

The gate of the amplification transistor 34 is connected to the floating diffusion part FD and the drain thereof is connected to a pixel power line 43. The amplification transistor 34 outputs the potential of the floating diffusion part FD after reset by the reset transistor 33 as a reset level. Furthermore, the amplification transistor 34 outputs the potential of the floating diffusion part FD after transfer of a signal charge by the transfer transistor 32 as a signal level.

Furthermore, for example, the drain of the selection transistor 35 is connected to the source of the amplification transistor 34 and the source thereof is connected to the vertical signal line 29. The selection transistor 35 is turned ON when a selection pulse φSEL is applied to the gate thereof through a selection line 45. A signal output from the amplification transistor 34 is relayed to the vertical signal line 29 while the pixel 22 is being selected.

Wiring lines in the lateral direction including the transfer line 42, the reset line 44, and the selection line 45 are common in the pixels on the same row and controlled by the vertical driving circuit 24.

Note that the selection transistor 35 may be connected between the pixel power line 43 and the drain of the amplification transistor 34 in the circuit configuration. In the above-described example of configuration, the pixel includes four transistors. Alternatively, the pixel may have three transistors by omitting the selection transistor.

Figure 5:
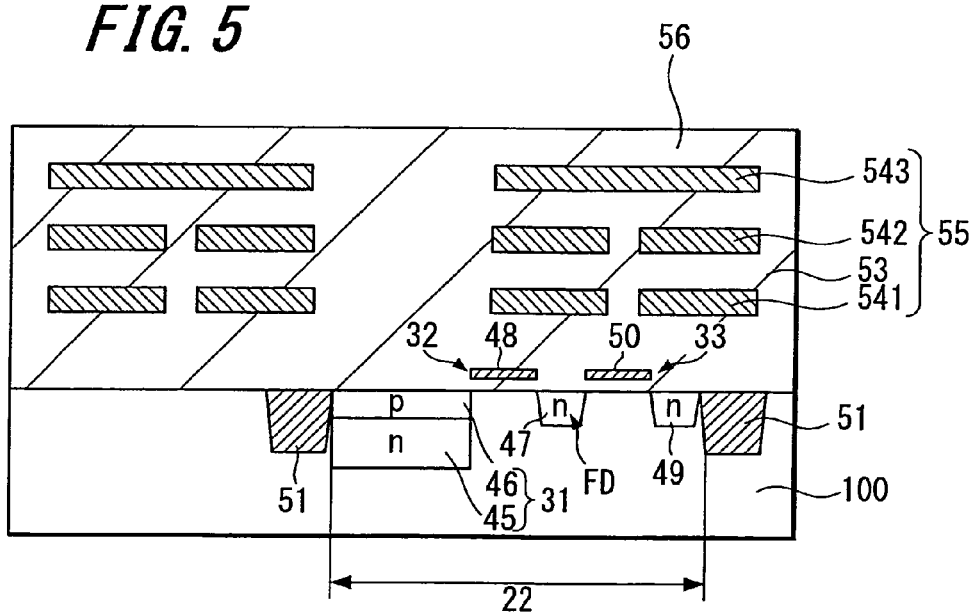
FIG. 5 is a schematic diagram illustrating the cross-sectional structure of the unit pixel.

FIG. 5 illustrates an example of a cross-sectional structure of main parts of the pixel. A unit pixel 22 includes a photodiode (PD) 31 having a first conductive type (e.g., n-type) charge storage area 45 and a second conductive (e.g., p-type) semiconductor area (that is, p-type accumulation layer) 46 on the surface of the area 45 and a plurality of pixel transistors (MOS transistors). The photodiode (PD) 31 and the plurality of pixel transistors are formed on a principal surface of a semiconductor substrate 100. The photodiode 31 functions as a photoelectric conversion portion. FIG. 5 illustrates the transfer transistor 32 and the reset transistor 33 among a plurality of pixel transistors. The transfer transistor 32 includes an n-type semiconductor area 47 provided as a floating diffusion part FD, a photodiode (PD) 31, and a transfer gate electrode 48 formed through a gate-insulating film. The reset transistor 33 includes an n-type semiconductor area 47 provided as a floating diffusion part FD, an n-type semiconductor area 49, and a reset gate electrode 50 formed through a gate-insulating film. The unit pixel 22 can be separated from an adjacent pixel by an element-separating area 51.

On the semiconductor substrate 100 on which pixels 22 are formed, a plurality of layers is formed through an insulating interlayer 53. In this example, three lines 54 [541, 542, and 543] made of metal films form the layers, making a plurality of wiring layers 55. A planarizing layer 56 is formed on the plurality of wiring layers 55. The lines 54 [541 to 543] can be formed at the area except of areas corresponding to the photodiodes (PD) 31. Furthermore, but not shown in the figure, later-described optical elements including a color filter, an on-chip micro-lens, and the like can be formed.

Furthermore, in the present embodiment, a sidewall having a light-blocking effect is formed on a lateral wall of an optical inner filter layer, which blocks infrared light, arranged above the plurality of wiring layers 55. Thus, oblique light can be prevented from passing through the optical inner filter layer and being incident on the adjacent pixel, while suppressing the generation of a color mixture.

Figure 6:
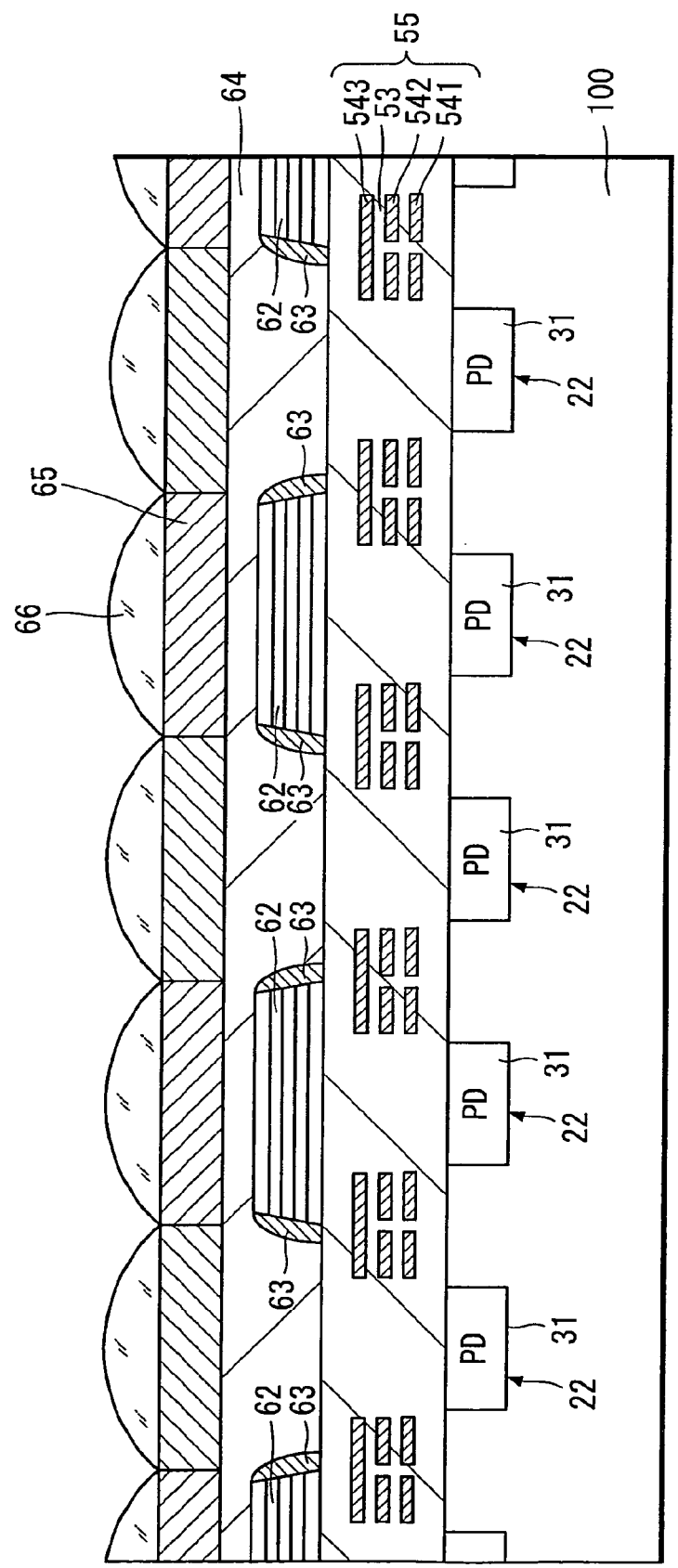
FIG. 6 is a schematic diagram illustrating main parts of a solid-state imaging device in accordance with a first embodiment of the present invention.

Next, FIG. 6 illustrates a cross-sectional structure of the main parts of a CMOS solid-state imaging device in accordance with a first embodiment of the present invention. In order to describe an embodiment of the present invention in a straightforward manner, a pixel is represented only by a photodiode PD and schematically described while omitting pixel transistors. The same will be applied to each of other embodiments described later.

As shown in FIG. 6, the CMOS solid-state imaging device 61 in accordance with the first embodiment includes a plurality of pixels 22, each having the photodiode (PD) 31, arranged in a two-dimensional array, on the principal surface of a semiconductor substrate 100. In addition, a plurality of layers is formed on the semiconductor substrate 100 through an insulating interlayer 53. In this example, three layered lines 54 [541, 542, and 543] form a plurality of wiring layers 55. An optical inner filter layer 62 for blocking infrared light is formed above the plurality of wiring layers 55, corresponding to a desired pixel. In addition, a side wall 63 having a light-blocking effect is formed on the lateral wall of the optical inner filter layer 62.

Furthermore, a planarized insulating layer that fills a space between the optical inner filter layers 62 adjacent to each other, that is, a planarizing layer 64 is formed. A color filter 65 and an on-chip micro lens 66 are formed in order on the planarizing layer 64.

Figure 7A:
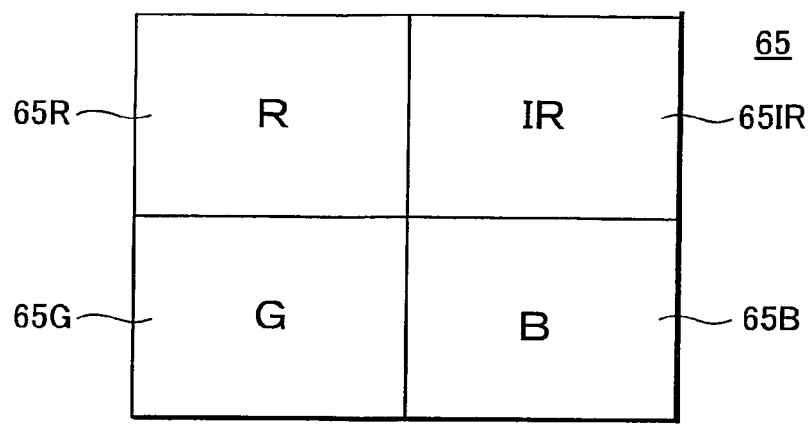
FIGS. 7A and 7B are plan views of an example of the arrangement of color filters used in an embodiment of the present invention.

As shown in FIG. 7A, in this example, the color filter 65 is laid out to have a red (R) filter component 65R, a green (G)

filter component 65G, a blue (B) filter component 65B, and a filter component which transmits all the wavelengths of light including infrared light (hereinafter, referred to as infrared light (IR) filter component for convenience) 65IR as one unit which is repetitively arranged. The pixel corresponding to the red filter component 65R is a red (R) pixel. The pixel corresponding to the green filter component 65G is a green (G) pixel. The pixel corresponding to the blue filter component 65B is a blue (B) pixel. The pixel corresponding to the infrared-light filter component 65IR is an infrared light (IR) pixel.

Figure 7B:
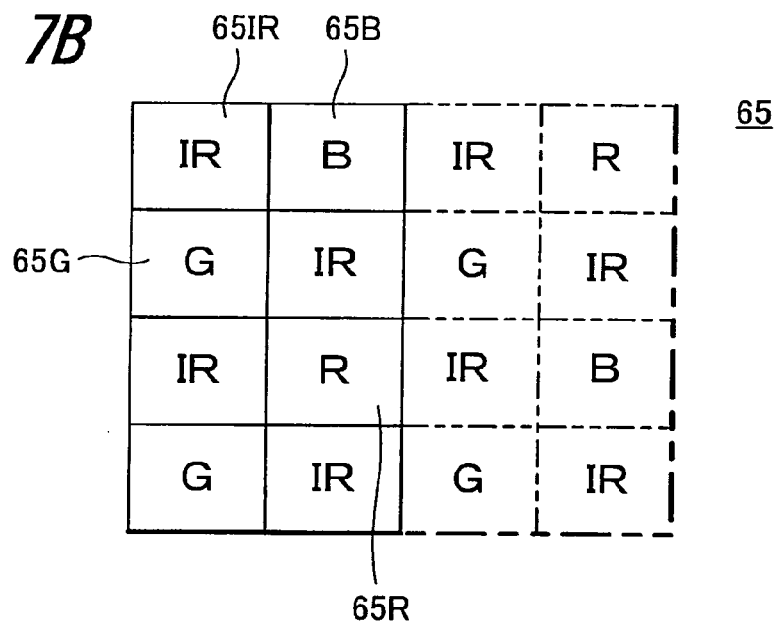

Another example of the color filter 65 is illustrated in FIG. 7B. This color filter 65 includes the following arrangements. That is, on the first row, the infrared-light filter component 65IR, the blue filter component 65B, the infrared-light filter component 65IR, and the red filter component 65 are repetitively arranged in this order in the horizontal direction. Also, on the second row, the green filter component 65G, the infrared-light filter component 65IR, the green filter component 65G, and the infrared-light filter component 65IR are repetitively arranged in this order in the horizontal direction. Furthermore, on the third row, the infrared-light filter component 65IR, the red filter component 65R, the infrared-light filter component 65IR, and the blue filter component 65B are repetitively arranged in this order in the horizontal direction. Still furthermore, on the fourth line, the green filter component 65G, the infrared-light filter component 65IR, the green filter component 65G, and the infrared-light filter component 65IR are arranged in this order in the horizontal direction. In other words, the color filter 65 is designed to have a repetitive arrangement of the first to fourth rows in the vertical direction (column direction).

Figure 8:
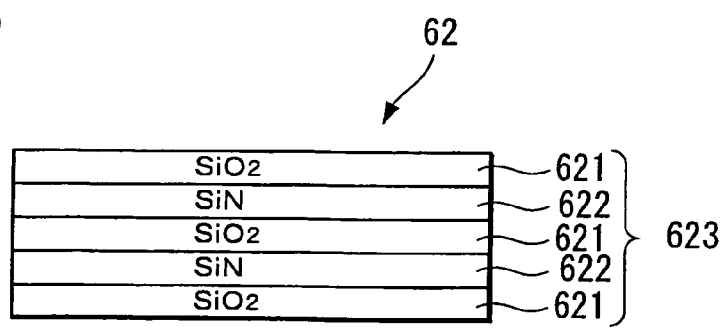
FIG. 8 is a schematic diagram illustrating an example of an optical inner filter layer formed of stacked dielectric films for blocking infrared light, which can be used in an embodiment of the present invention.

The above optical inner filter layer 62 is formed so as to correspond to three color pixels, the R pixel, the G pixel, and the B pixel, excluding the IR pixel. As shown in FIG. 8, the optical inner filter layer 62 is formed as a stacked film made of dielectric films with different refractive indexes. For example, the optical inner filter layer 62 may be a stacked dielectric film 623 in which a silicon oxide ($SiO_2$) film 62 with a predetermined thickness and a silicon nitride (SiN) film 622 with a predetermined thickness are alternately stacked more than once.

A side wall 63 formed on the lateral wall of the optical inner filter layer 62 is preferably made of a material having reflectivity as well as a light-blocking effect. In this example, the side wall 63 is made of a metal film. The metal film may be a tungsten (W) film, an aluminum (Al) film, titanium (Ti) film, or another metal film.

Figure 9:
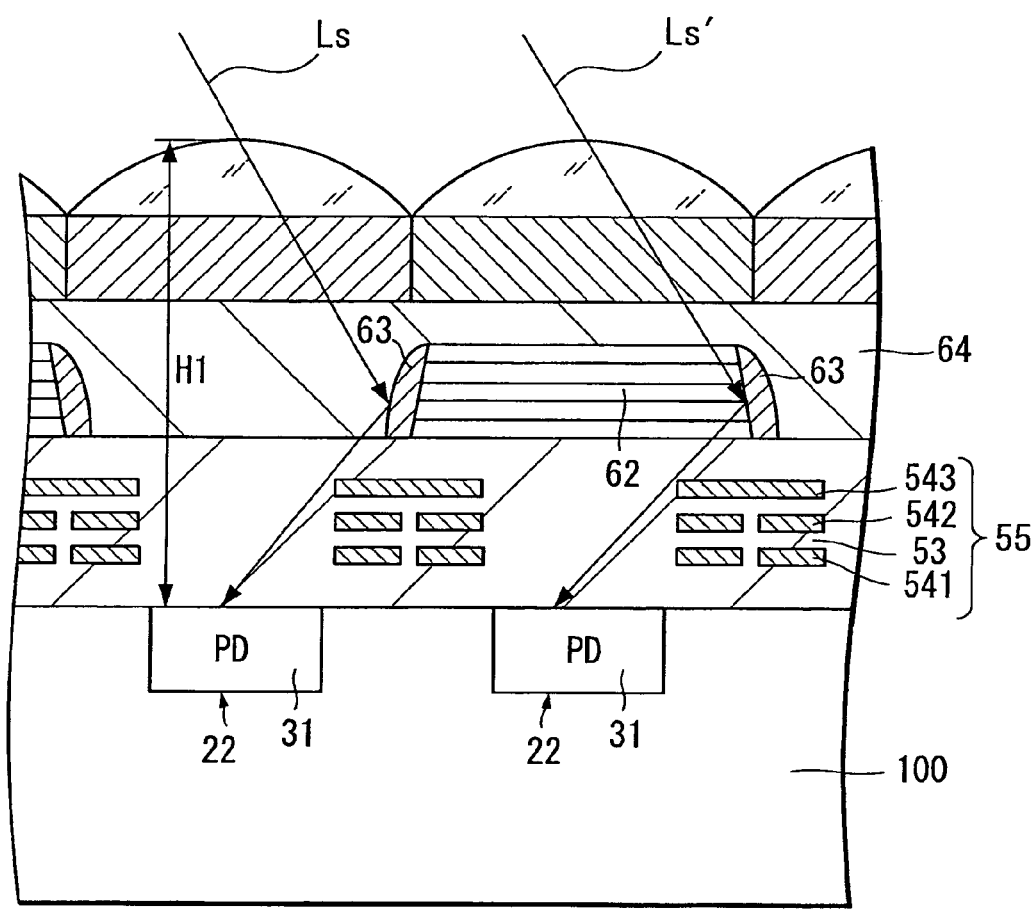
FIG. 9 is an explanatory diagram illustrating the operation of the solid-state imaging device in accordance with the first embodiment of the present invention.

According to the configuration of the CMOS solid-state imaging device 61 of the first embodiment, as described above, the side wall with a light-blocking effect (in this example, the side wall 63 formed of a metal film) is formed on the lateral wall of the optical inner filter layer 62. As shown in FIG. 9, such a side wall 63 made of a metal film blocks and prevents light incident on the IR pixel, particularly oblique light Ls, from passing through the optical inner filter layer 62 on the adjacent pixel. Thus, the light can be prevented from reaching to the adjacent pixel. Furthermore, light passing through the optical inner filter layer 62 and incident on the R pixel, the G pixel, and the B pixel, particularly oblique light Ls', is blocked by the side wall 63 made of the metal film even if the oblique light Ls' may proceed toward the adjacent pixel. Thus, the light can be prevented from reaching to the adjacent pixel. Consequently, since the optical inner filter layer 62 is provided, the generation of a color mixture can be suppressed even if the distance H1 from the light-receiving surface of the photodiode PD 31 to the on-chip micro lens 66 is large. In addition, the generation of shading can also be suppressed.

Furthermore, since the side wall 63 is made of a metal film, the side wall 63 has reflectivity. Thus, the rays of oblique light Ls and Ls' can be reflected on the side wall 63 and then incident on the photodiode (PD) 31 of the corresponding IR pixel, R pixel, G pixel, and B pixel, respectively. The light that might pass through the optical inner filter layer 62 is incident on the photodiode 31 of the pixel on which the light is originally incident, so that probability of allowing light to reach to the photodiode 31 of each pixel can increase and an improvement in sensitivity can be obtained.

Therefore, taking advantage of the benefit of the optical inner filter layer, a CMOS solid-state imaging device having high reliability while suppressing a color mixture can be provided.

Figure 10:
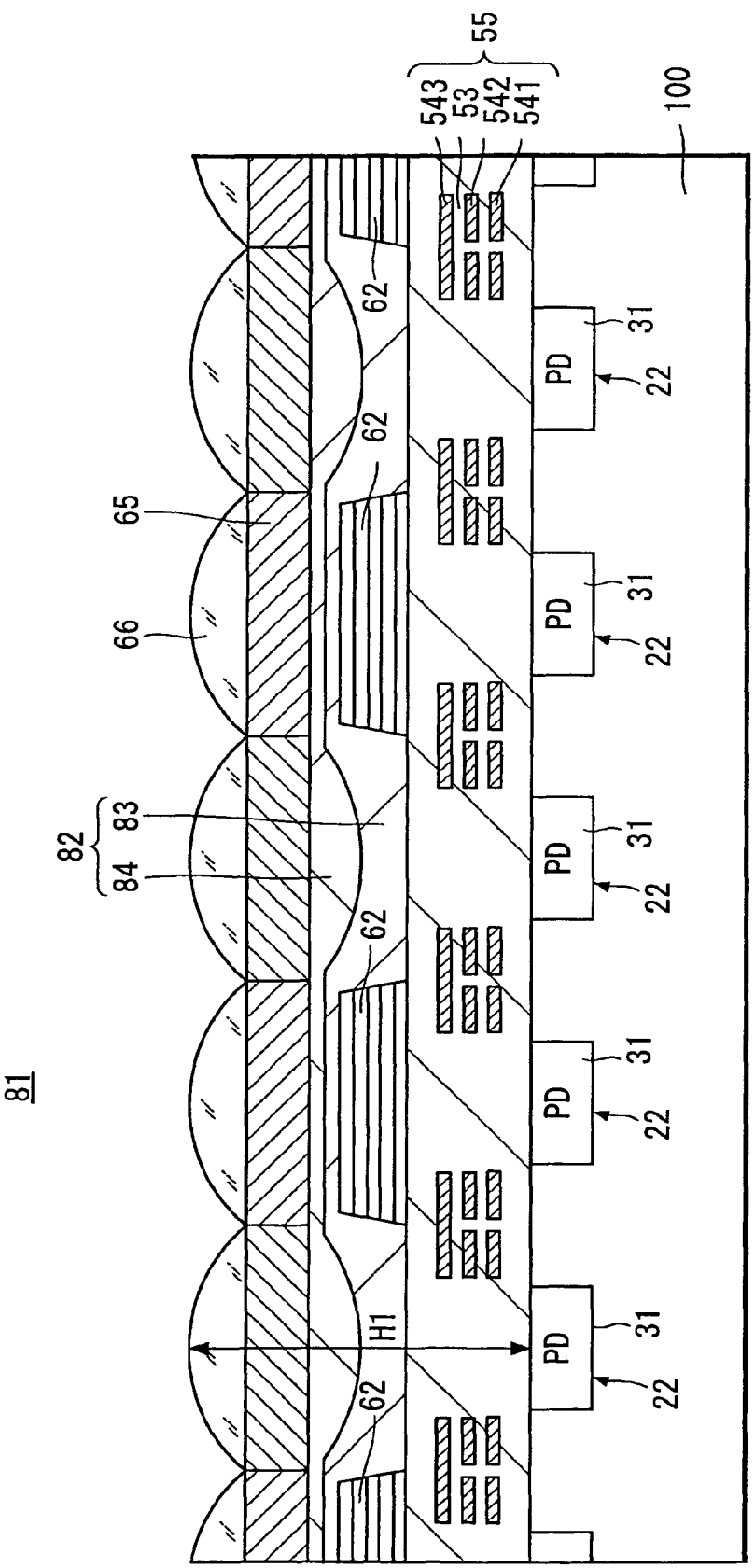
FIG. 10 is a schematic diagram illustrating an example of main parts of a solid-state imaging device to be applied to an embodiment of the present invention.

FIG. 10 illustrates an example in which an inner-layer lens is incorporated in the CMOS solid-state imaging device having the optical inner filter layer without a change in distance H1 from the light-receiving surface of the photodiode (PD) to the on-chip micro lens. The CMOS solid-state imaging device 81 of the present example has a plurality of pixels 22 with their respective photodiodes (PDs) 31, which are arranged in a two dimensional array on the principal surface of the semiconductor substrate 100 in a manner similar to one illustrated in FIG. 6 as described above. A plurality of wiring layers 55 including a plurality of lines 54 [541, 542, and 543] stacked through an insulating interlayer 53 is formed on the substrate 100. In addition, an optical inner filter layer 62 made of dielectric stacked films is formed above the plurality of wiring layers 55. However, the above-described side wall 63 with a light-blocking effect is not formed on the optical inner filter layer 62.

Furthermore, a downwardly-convexed inner-layer lens 82 is formed on the interlayer that fills a space between the optical inner filter layers 62 adjacent to each other. In other words, the downwardly-convexed inner-layer lens 82 is formed so as to correspond to the photodiode 31 of the IR pixel. The inner-layer lens 82 is formed of a first interlayer 83 and a second interlayer 84 which have different refractive indexes N. In this example, the first interlayer 83 is formed of a BPSG (boron phosphorous silicate glass) film and the second interlayer 84 is formed of a silicon nitride (SiN) film having a refractive index N higher than that of the BPSG film, thereby forming the downwardly-convexed inner-layer lens 82. Furthermore, a color filter 65 and an on-chip micro lens 66 are formed through a planarizing layer.

According to the configuration of the CMOS solid-state imaging device 81 as described above, the interlayer between the optical inner filter layers 62 adjacent to each other is provided with the downwardly-convexed inner-layer lens 82. Accordingly, the probability of allowing the light to reach to the photodiode 31 of the IR pixel can increase and an improvement in sensitivity can be ensured. Besides, the inner-layer lens 82 is formed between the optical inner filter layers 62 adjacent to each other. Therefore, an inner-layer lens can be incorporated without an increase in distance H1 from the light-receiving surface of the photodiode 31 to the on-chip micro lens 66.

Figure 11:
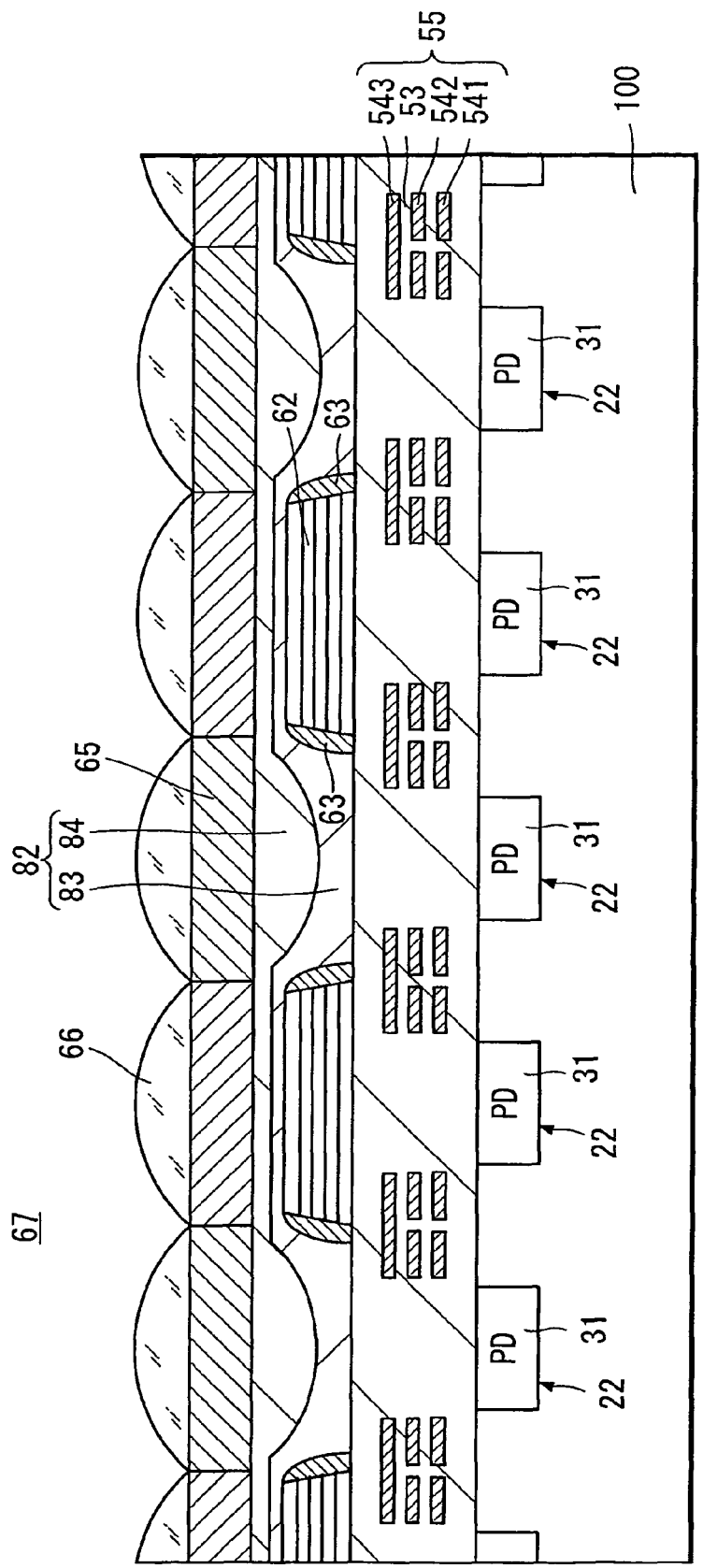
FIG. 11 is a schematic diagram illustrating main parts of a solid-state imaging device in accordance with a second embodiment of the present invention.

FIG. 11 illustrates a CMOS solid-state imaging device in accordance with a second embodiment of the present invention. This CMOS solid-state imaging device is provided with the inner-layer lens 82 shown in FIG. 10. In the CMOS solid-state imaging device 67 of the present embodiment, an optical inner filter layer (IR cut filter layer) 62 is formed between the plurality of wiring layers 55 and the color filter 65, corresponding to a desired pixel. In addition, a side wall 63 with a light-blocking effect (in this example, a side wall formed of a metal film) is formed on the lateral wall of the optical inner filter layer 62. Then, a downwardly-convexed inner-layer lens 82 as shown in FIG. 10 is formed on the interlayer between the optical inner filter layers 62 adjacent to each other, corresponding to the photodiode 31 of the IR pixel. The inner-layer lens 82 includes a first interlayer 83 (in this example, a BPSG film) and a second interlayer 84 (in this example, a silicon nitride film) having a refractive index higher than that of the first interlayer 83. Other structural components of the CMOS solid-state imaging device 67 rare identical with those illustrated in FIG. 6 as described above, so that the same reference numerals will be added to the structural components corresponding to those of FIG. 6 to omit overlapping description.

According to the configuration of the CMOS solid-state imaging device 67 in accordance with the second embodiment, the side wall 63 made of the metal film is formed on the lateral wall of the optical inner filter layer 62, in a manner as illustrated in FIG. 6, so that oblique light is blocked by and reflected from the side wall 63. Therefore, the light can be prevented from reaching to the adjacent pixel and the generation of a color mixture can be suppressed and reduced while increasing the probability of allowing the light to reach to each of the photodiodes 31 of the R pixel, the G pixel, the B pixel, and the IR pixel. Thus, an improvement in sensitivity can be ensured. Furthermore, the downwardly-convexed inner-layer lens 82 is formed on the interlayer between the optical inner filter layers 62 adjacent to each other, so that the inner-layer lens 82 can be incorporated without an increase in distance H1 from the light-receiving surface to the on-chip micro lens 66. Thus, the probability of allowing the light to reach to the photodiode 31 of the IR pixel can increase and an improvement of sensitivity can be attained.

Next, as an embodiment of the present invention, FIGS. 12 to 14 illustrate a method of producing the CMOS solid-state imaging device 67 of the above second embodiment.

Figure 12A:
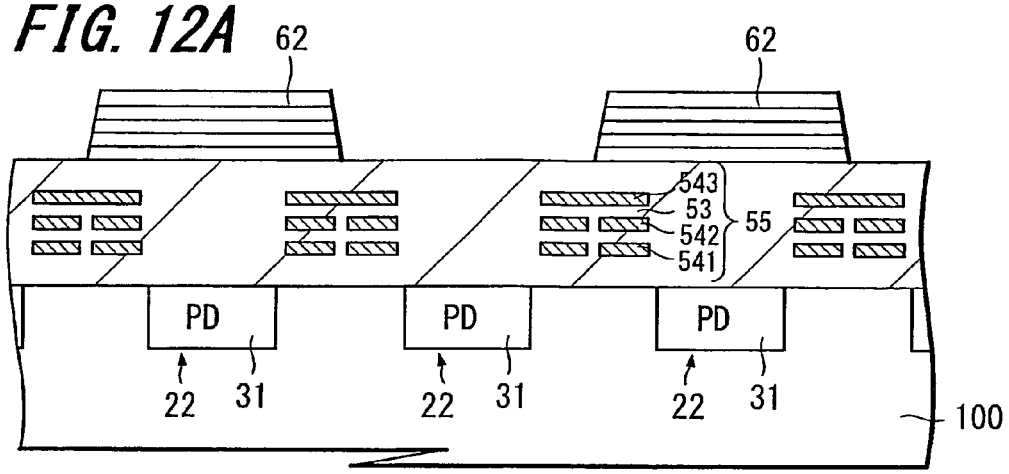
FIGS. 12A to 12C are schematic diagrams illustrating a first part of process for producing the solid-state imaging device in accordance with the second embodiment of the present invention, where

First, as shown in FIG. 12A, a device-separating area (not shown), a plurality of pixels 22 with photodiode (PD) 31, and the like are formed on the principal surface of the semiconductor substrate 100, followed by forming a plurality of wiring layers 55 including the insulating interlayer 53 and a plurality of lines 54 [541, 542, and 543]. The wiring lines 54 can be formed of a conductive film with a light-blocking effect, such as a Cu line or Al line. Furthermore, the optical inner filter layer 62 formed of a plurality of the layered dielectric films is formed above the plurality of wiring layers 55, corresponding to the R pixel, the G pixel, and the B pixel except of the IR pixel.

Figure 12B:
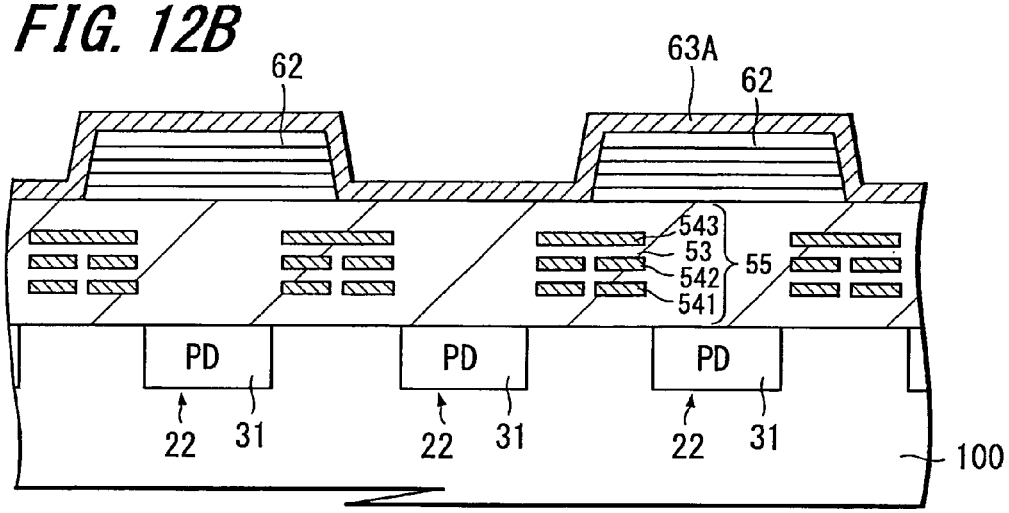

Next, as shown in FIG. 12B, a light-shielding material film 63A (in this example, a metal film of tungsten (W) or aluminum (Al)) is formed in a predetermined film thickness so that the film can extend along the surface of the optical inner filter layer 62.

Figure 12C:
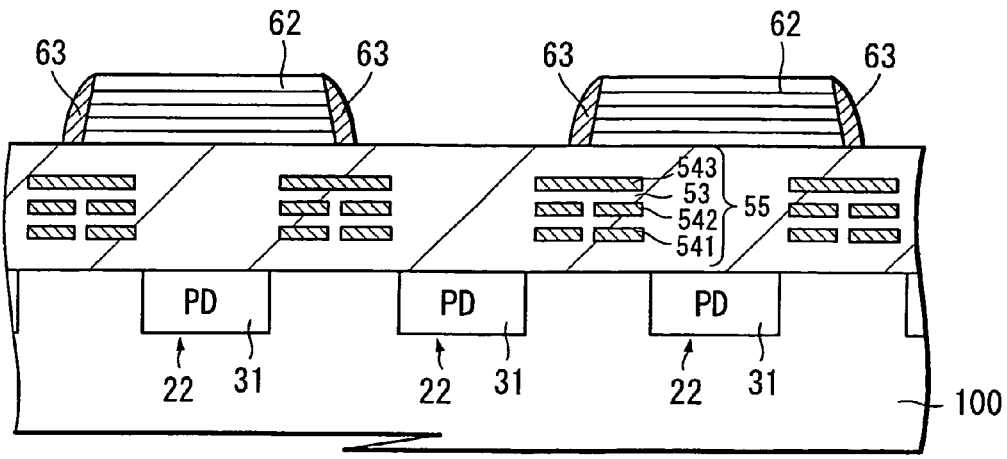

Next, as shown in FIG. 12C, the light-shielding material film 63A is subjected to an etch-back process to form the light-shielding material film 63 (in this example, a side wall 63 formed of a metal film) on the lateral wall of the optical inner filter layer 62.

Figure 13D:
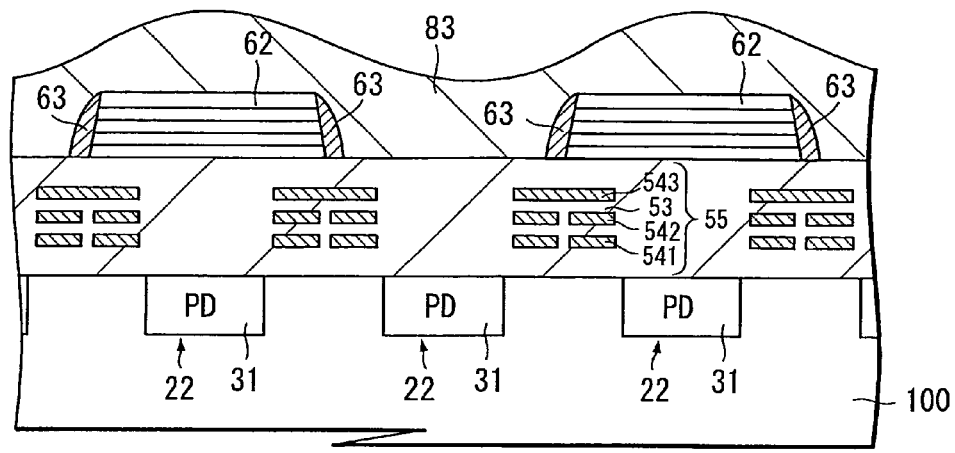
FIGS. 13D to 13F are schematic diagrams illustrating a second part of process for producing the solid-state imaging device in accordance with the second embodiment of the present invention, where

Next, as shown in FIG. 13D, a first interlayer 83 (in this example, a BPSG film) with a first refractive index is formed on the whole surface of the substrate 100 including the surface of the optical inner filter layer 62. The first interlayer 83 is formed so that it can fill a space between the optical inner filter layers 62 adjacent to each other. Therefore, the surface of the first interlayer 83 is provided with irregularity.

Figure 13E:
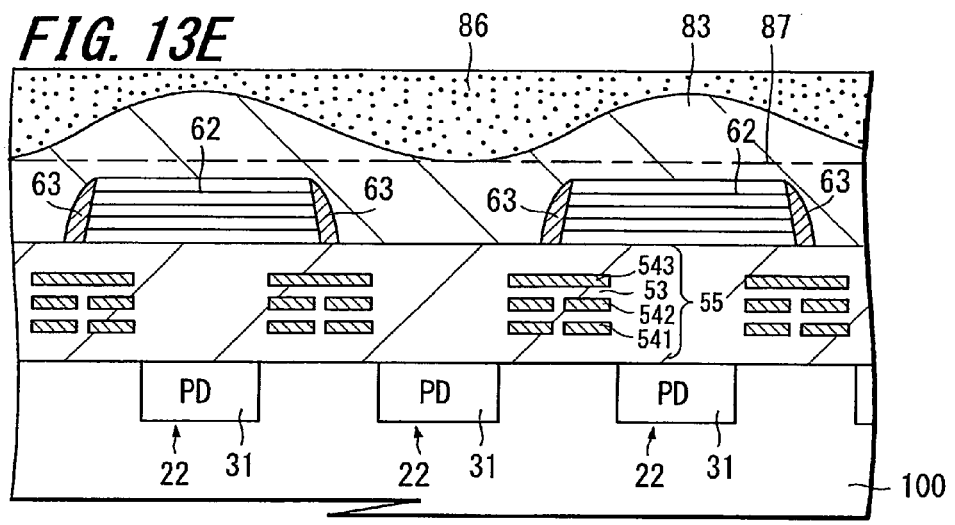

Next, as shown in FIG. 13E, a photoresist film 86 is formed on the first interlayer 83 so that the surface of the first interlayer 83 can be planarized by filling the irregular portions on the surface thereof. Here, the etching rate of the first interlayer 83 is equal to that of the resist film 86.

Figure 13F:
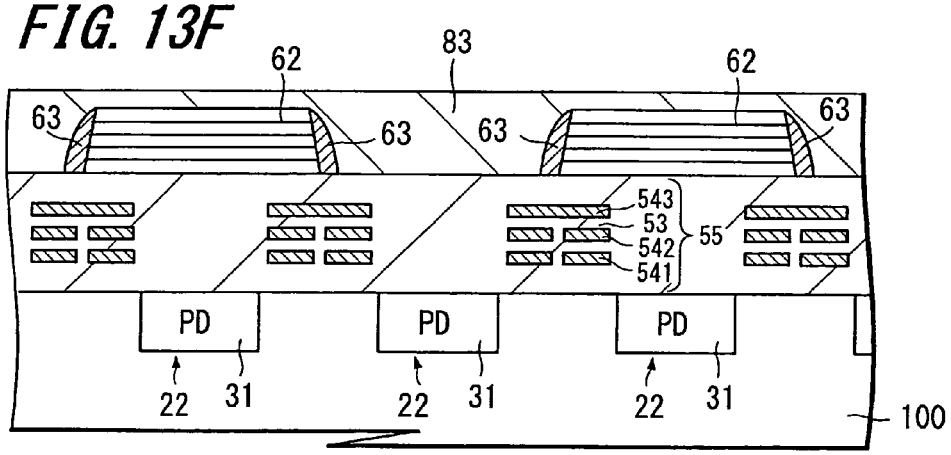

Next, the photoresist film 86 and the first interlayer 83 are etched back to the height shown by the broken line 87 in FIG. 13E to form the surface-planarized first interlayer 83 as illustrated in FIG. 13F.

Figure 14G:
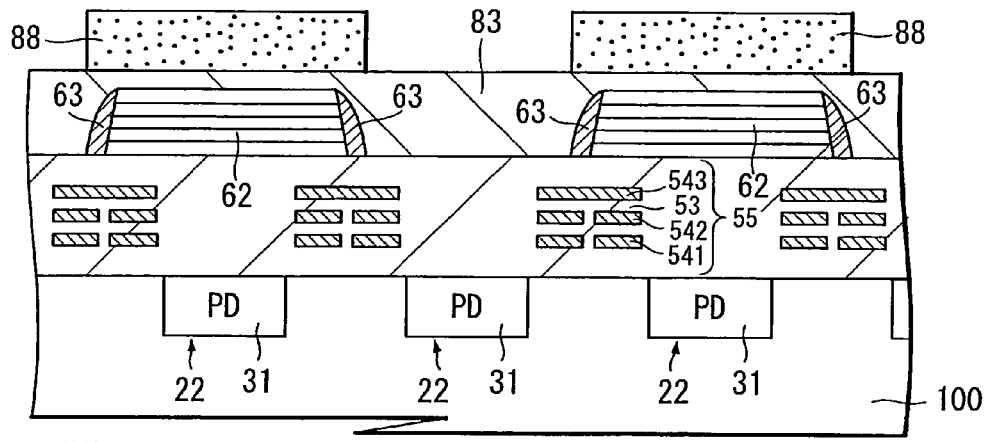
FIGS. 14G to 14I are schematic diagrams illustrating a third part of process for producing the solid-state imaging device in accordance with the second embodiment of the present invention, where
Figure 14H:
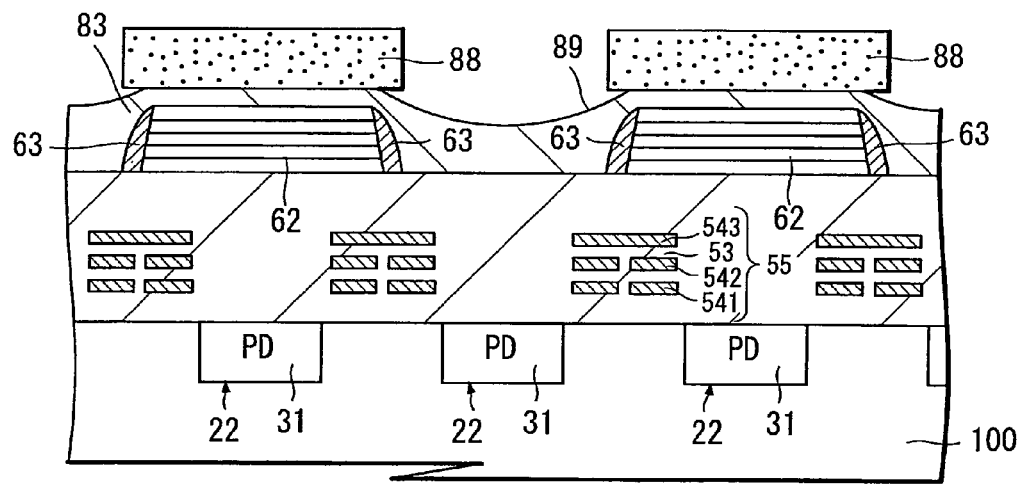

Next, as shown in FIG. 14G, a photolithography technique and an etching technique are employed to form a resist mask 88 in a position corresponding to each of the optical inner filter layers 62 on the first interlayer 83. The resist mask 88 is formed so that it can be provided with an area somewhat larger than the area of the optical inner filter layer 62 on which the side wall 63 is formed, when seen from the plane. Next, as shown in FIG. 14H, a chemical dry-etching process or the like is carried out on the first interlayer 83 through the resist mask 88 to isotropically remove the first interlayer 83. Therefore, a concaved portion 89 having a concavely-curved surface with a desired curvature is formed on the first interlayer 83 between the optical inner filter layers 62.

Figure 14I:
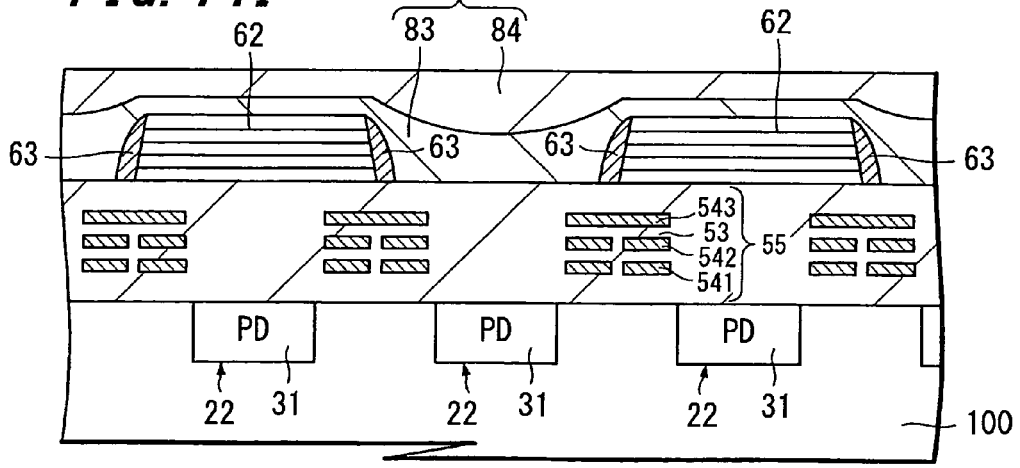

Next, as shown in FIG. 14I, a second interlayer 84 (in this example, a silicon nitride (SiN) film) having a refractive index higher than that of the first interlayer 83 is formed on the whole upper surface of the first interlayer 83 so that the concaved portion 89 can be filled therewith. Subsequently, an etch-back treatment is carried out to form a surface-planarized second interlayer 84. A downwardly-convexed inner-layer lens 82 is formed of the first interlayer 83 and the second interlayer 84 that fills the concaved portion 89 of the first interlayer 83.

In the subsequent steps, a color filter 65 and an on-chip micro lens 66 are formed on the second interlayer 84 to obtain the CMOS solid-state imaging device 67 in accordance with the second embodiment as illustrated in FIG. 11.

Figure 15:
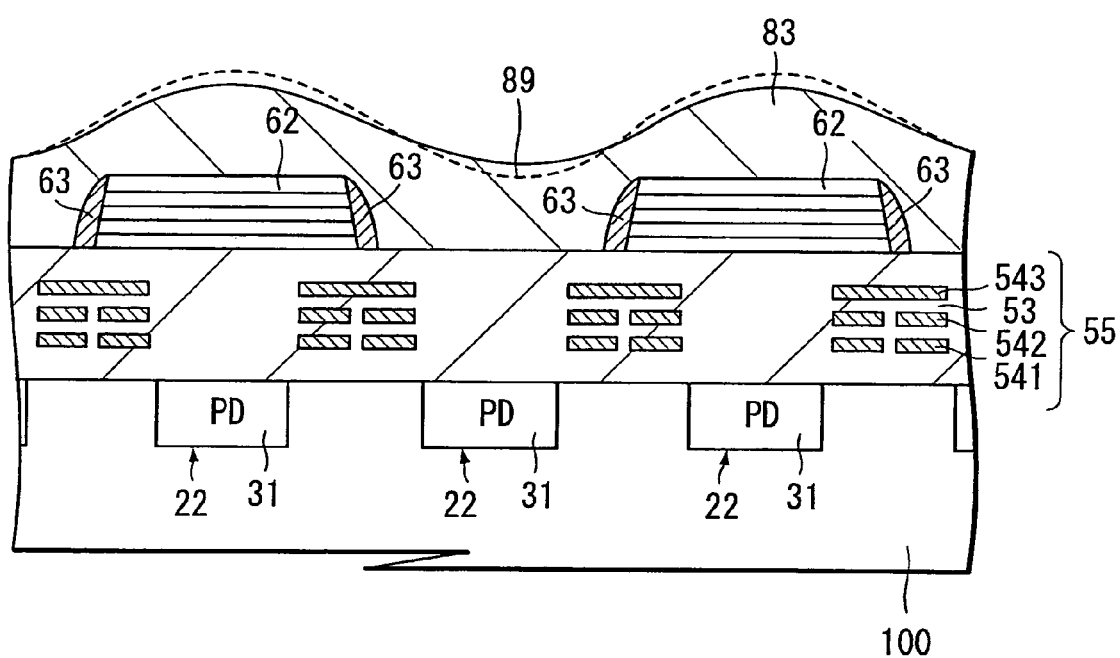
FIG. 15 is a schematic diagram illustrating another example of process for producing the solid-state imaging device in accordance with the second embodiment of the present invention.

It should be noted that there are other methods for forming the concaved portion 89 in the first interlayer 83. As shown in FIG. 15, for example, another method includes the steps of forming an optical inner filter layer 62 with a side wall 63, forming the first interlayer 83, and carrying out a reflow process at a predetermined temperature making use of the irregularity of the surface. In this process, the first interlayer 83 ref lows and the concaved portion 89 having the concavely-curved surface with a desired curvature can be formed on the first interlayer 83 between the optical inner filter layers 62.

Figure 16:
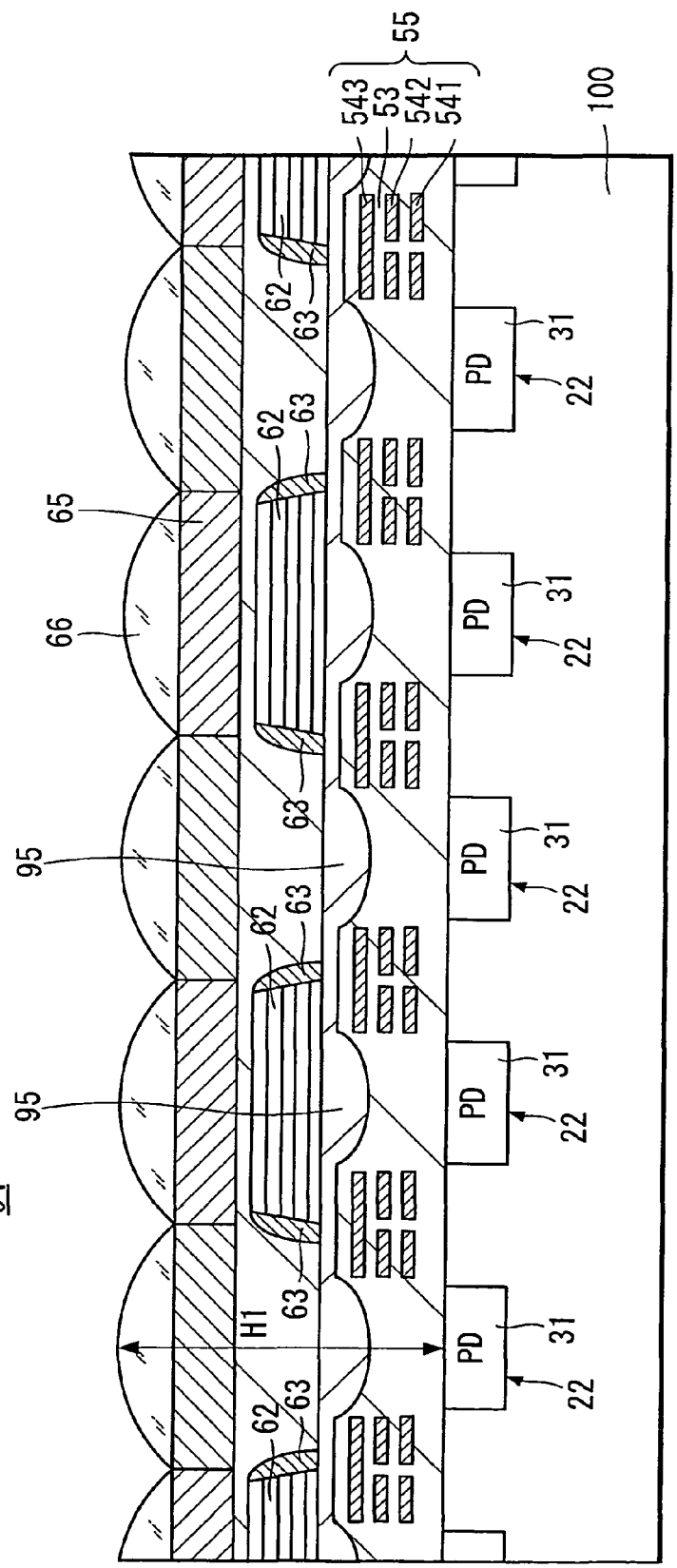
FIG. 16 is a schematic diagram illustrating main parts of a solid-state imaging device in accordance with a third embodiment of the present invention.

FIG. 16 illustrates a CMOS solid-state imaging device in accordance with a third embodiment of the present invention. The CMOS solid-state imaging device 94 of the present embodiment is provided with an optical inner filter layer 62 (IR cut filter layer) formed between a plurality of wiring layers 55 and a color filter 65, corresponding to a desired pixel. On the lateral wall of the optical inner filter layer 62, a side wall 63 with a light-blocking effect (in the present example, a side wall formed of a metal film) is formed. Furthermore, the CMOS solid-state imaging device 94 includes a downwardly-convexed inner-layer lens 95 formed with two layers with different refractive indexes in an interlayer between a plurality of wiring layers 55 where no layered lines 54 [541 to 543] are formed. Specifically, the downwardly-convexed inner-layer lens 95 is formed by using an insulating interlayer 53 on the area between layered lines 54 adjacent to each other, corresponding to each of the photodiodes (PDs) 31 of the IR pixel, the R pixel, the G pixel, and the B pixel. Other structural components of the CMOS solid-state imaging device 94 are identical with those illustrated in FIG. 6 as described above, so that the same reference numerals will be added to the structural components corresponding to those of FIG. 6 to omit overlapping description.

According to the CMOS solid-state imaging device 94 of the third embodiment, the side wall 63 formed of the metal film is formed on the lateral wall of the optical inner filter layer 62. Therefore, in a manner similar to one illustrated in FIG. 6, oblique light can be blocked by and reflected from the side wall 63. Therefore, light is prevented from reaching to the adjacent pixel and the generation of a color mixture can be suppressed and reduced. Moreover, probability of allowing the light to reach to each photodiode 31 of the R pixel, the G pixel, the B pixel, and the IR pixel can increase and sensitivity can be improved. Furthermore, every pixel is provided with the inner-layer lens 95 in the form of a downwardly-convexed shape using the insulating interlayer 53 between the plurality of wiring layers 55. Therefore, a CMOS solid-state imaging device incorporating an inner-layer lens can be obtained in which the probability of allowing the light to reach to the photodiodes of all pixels can increase while the distance H1 from the light-receiving surface of the photodiode 31 to the on-chip micro lens 66 can be prevented from increasing.

Figure 17:
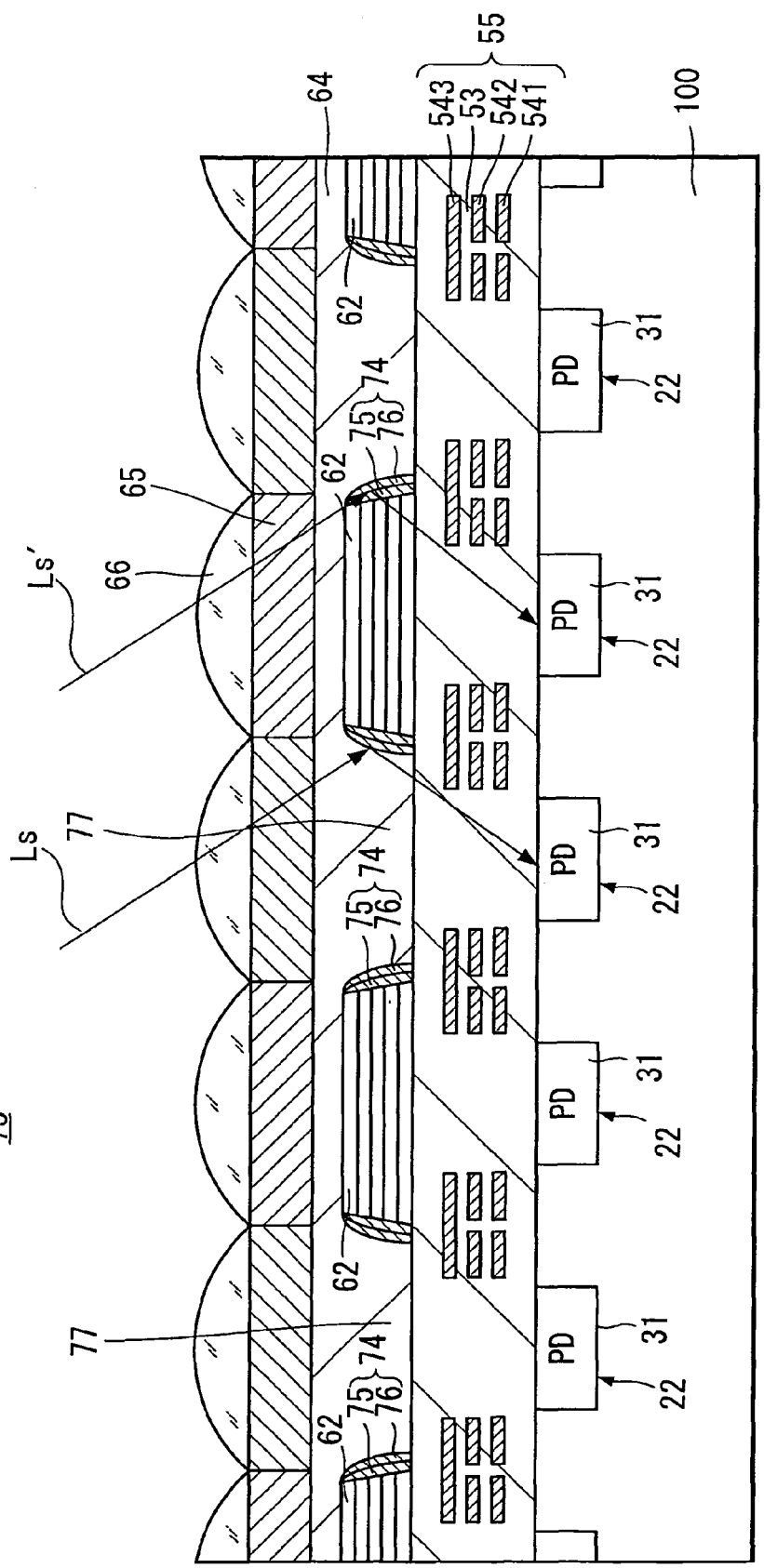
FIG. 17 is a schematic diagram illustrating main parts of a solid-state imaging device in accordance with a fourth embodiment of the present invention.

FIG. 17 illustrates a CMOS solid-state imaging device in accordance with a fourth embodiment of the present invention. The CMOS solid-state imaging device 73 of the present embodiment is formed such that a side wall 74 with a light-blocking effect and reflectivity using a difference in refractive index is formed on the lateral wall of an optical inner filter layer 62. The side wall 74 is formed of a film having a plurality of layers with different refractive indexes, such as two stacked films, an insulating film 75 and an insulating film 76. In this case, the inner insulating film 75 is formed of, for example, a silicon nitride (SiN) film with a refractive index of 2.0 and an outer insulating film 76 is formed of, for example, a silicon oxide film with a refractive index of about 1.4. Furthermore, a light-transmissive interlayer 77 adjacent to the outer insulating film 76 is made of a material having a refractive index different from that of the outer insulating film 76. For example, it may be formed of a silicon nitride (SiN) film with a refractive index of 2.0. The interlayer 77 may have a configuration similar to a waveguide including the outer insulating film 76 of the side wall 74 as a clad and the interlayer 77 as a core. The oblique light Ls incident on the interlayer 77 is totally reflected on the boundary between the interlayer 77 and the outer insulating film 76 of the side wall 74, thereby traveling to the photodiode 31. The oblique light Ls' incident on the optical inner filter layer 62 is totally reflected on the boundary of the inner insulating film 75 and the outer insulating film 76 of the side wall 74 and then travels to the photodiode 31.

Other structural components of the CMOS solid-state imaging device 73 are identical with those illustrated in FIG. 6 as described above, so that the same reference numerals will be added to the structural components corresponding to those of FIG. 6 to omit overlapping description.

According to the CMOS solid-state imaging device 73 of the fourth embodiment, the side wall 74 formed of a plurality of layers, the insulating film 75 and the insulating film 76, with different refractive indexes is formed on the lateral wall of the optical inner filter layer 62. In addition, the interlayer with a refractive index different from that of the outer insulating film 76 is formed. Therefore, such a configuration of the CMOS solid-state imaging device 73 allows the oblique light to be blocked by and reflected from the boundary between the interlayer 77 and the side wall 74 or the boundary between the insulating film 75 and the insulating film 76 of the side wall 74. Accordingly, light is prevented from reaching to the adjacent pixel and the generation of a color mixture can be suppressed and reduced. Moreover, probability of allowing the light to reach to each photodiode 31 of the R pixel, the G pixel, the B pixel, and the IR pixel can increase and sensitivity can be improved.

Alternatively, the CMOS solid-state imaging device 73 of the fourth embodiment may have a configuration using a combination of inner-layer lenses 82, 95, or the like shown in FIG. 10 and FIG. 16 as described above.

Furthermore, in the embodiments illustrated in FIGS. 16 and 17, an inner-layer lens 82 (see FIG. 10) may be formed above the optical inner filter layer 62 having the side wall 63 (FIG. 16) or the side wall 74 (FIG. 17), corresponding to each of the R pixel, the G pixel, the B pixel, and the IR pixel. In addition, in the fourth embodiment as illustrated in FIG. 17, both the inner-layer lens 82 and the inner-layer lens 95 (see FIG. 10 and FIG. 16) may be formed. The CMOS solid-state imaging device of such embodiment includes the optical inner filter layer 62 provided with the side wall 63 or 74 having a light-blocking effect. Thus, the generation of a color mixture can be suppressed and reduced. Furthermore, probability of allowing the light to reach to the photodiode 31 of each pixel can increase and sensitivity can be improved.

The CMOS solid-state imaging device 61 shown in FIG. 6 can be produced according to the steps shown in FIGS. 12A to 13F as described above.

The CMOS solid-state imaging device 94 shown in FIG. 16 can be produced according to the steps shown in FIGS. 12A to 13F after forming the inner-layer lens 95 on the insulating interlayer 53 between the plurality of wiring layers 55 according to the steps shown in FIGS. 14G to 14I as described above.

The CMOS solid-state imaging device 73 shown in FIG. 17 can be produced according to the steps shown in FIGS. 12A to 13F. In other words, the side wall 74 can be formed by repeating the steps shown in FIGS. 12B to 12C two times after carrying out the step shown in FIG. 12A.

In the above-described embodiments, for example, the pixel includes one photodiode and four pixel transistors as illustrated in FIG. 4. However, not shown in the figures, the embodiments of the present invention may be applied to a CMOS solid-state imaging device called pixel-sharing type in which a plurality of photodiodes may share a pixel transistor.

Figure 18:
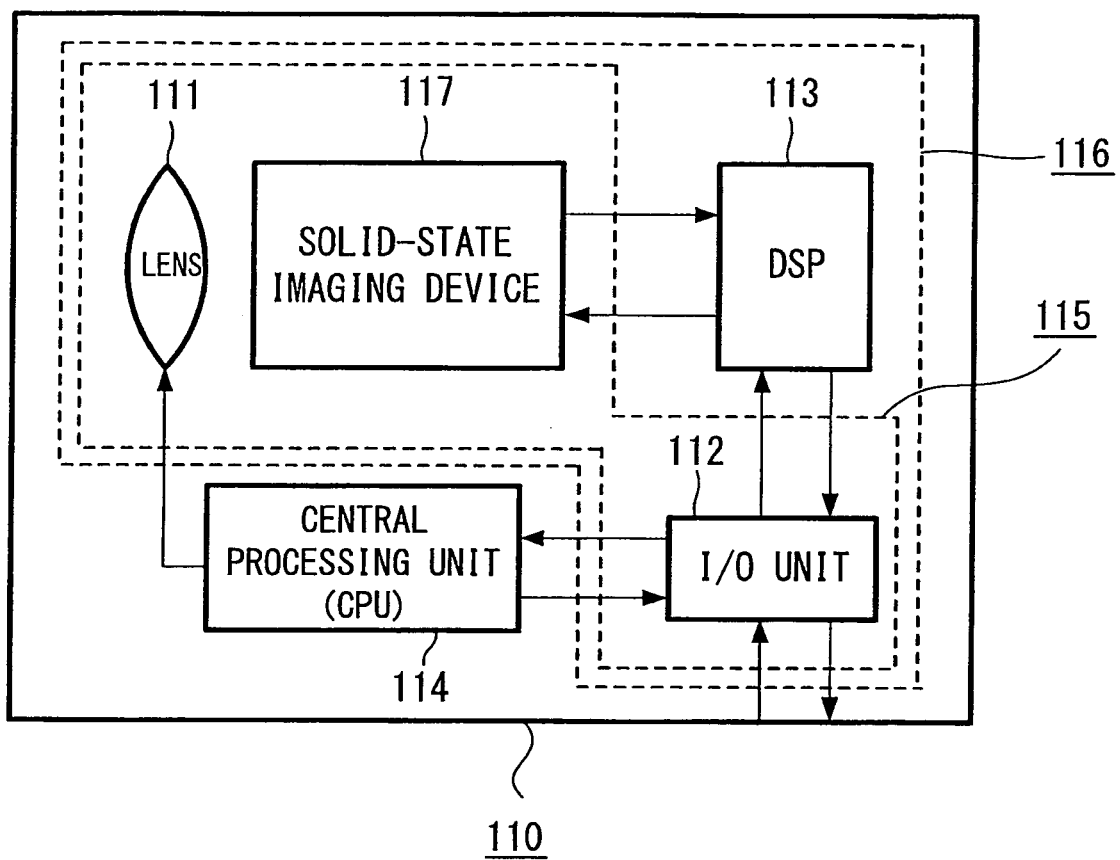
FIG. 18 is a schematic diagram illustrating the configuration of a camera module in accordance with an embodiment of the present invention.

FIG. 18 illustrates the schematic configuration of a camera module in accordance with an embodiment of the present invention. The camera module 110 of the present embodiment includes the CMOS solid-state imaging device 117 of any of the above-described embodiments, an optical lens system 111, an input/output (I/O) unit 112, a digital signal processor (DSP) 113, and a central processing unit (CPU) 114 into one unit. In addition, for example, a camera module 115 may only include the CMOS solid-state imaging device 117, the optical lens system 111 and the I/O unit 112. Furthermore, a camera module 116 may include the CMOS solid-state imaging device 117, the I/O unit 112, and the digital signal processor (DSP) 113.

According to the camera module of the present embodiment, the generation of an optical color mixture in the adjacent pixel can be suppressed, sensitivity can be improved, and a bright image of a dark subject can be taken using infrared light.

Furthermore if the CMOS solid-state imaging device according to an embodiment of the present invention is applied to an imaging camera, the generation of an optical color mixture in the adjacent pixel can be suppressed, sensitivity can be improved, and a bright image of a dark subject can be taken using infrared light.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a plurality of arrayed pixels each including a photoelectric conversion portion and a pixel transistor;
   an optical inner filter layer for blocking infrared light, which is formed facing to a light-receiving surface of the photoelectric conversion portion of a desired pixel among the arrayed pixels; and
   a light-blocking side wall formed on a lateral wall of the optical inner filter layer,
   wherein said side wall includes an outer insulating film and an inner insulating film, said inner insulating film being between said optical inner filter layer and said outer insulating film.

2. A solid-state imaging device comprising:
   an optical inner filter between a first filter component of a filter layer and a first photoelectric conversion portion of a substrate, a side wall being on the optical inner filter,
   wherein first oblique light is transmissible through said first filter component and said optical inner filter, said side wall being configured to reflect said first oblique light onto said first photoelectric conversion portion, and
   wherein said side wall includes an outer insulating film and an inner insulating film, said inner insulating film being between said optical inner filter and said outer insulating film.

3. The solid-state imaging device according to claim 2, wherein said first filter component is a color filter component.

4. The solid-state imaging device according to claim 3, wherein said color filter component is from the group consisting of a red filter component, a green filter component, and a blue filter component.

5. The solid-state imaging device according to claim 2, wherein a refractive index of the inner insulating film is higher than a refractive index of the outer insulating film.

6. The solid-state imaging device according to claim 2, wherein second oblique light is transmissible through a second filter component of the filter layer, said side wall being configured to reflect said second oblique light onto a second photoelectric conversion portion of the substrate.

7. The solid-state imaging device according to claim 6, wherein said second filter component is an infrared-light filter component.

8. The solid-state imaging device according to claim 6, wherein said first photoelectric conversion portion is configured to convert said first oblique light into first electric signal charges, said second photoelectric conversion portion being configured to convert said second oblique light into second electric signal charges.

9. The solid-state imaging device according to claim 6, wherein said side wall is configured to prevent said first oblique light from reaching said second photoelectric conversion portion.

10. The solid-state imaging device according to claim 6, wherein said side wall is configured to prevent said second oblique light from reaching said first photoelectric conversion portion.

11. The solid-state imaging device according to claim 6, wherein said first oblique light is wavelengths of visible light, said second oblique light including infrared light and said visible light.

12. The solid-state imaging device according to claim 11, wherein said optical inner filter is configured to block said infrared light.

13. The solid-state imaging device according to claim 11, wherein said wavelengths of the visible light include red wavelengths of the visible light.

14. The solid-state imaging device according to claim 11, wherein said wavelengths of the visible light include green wavelengths of the visible light.

15. The solid-state imaging device according to claim 11, wherein said wavelengths of the visible light include blue wavelengths of the visible light.

16. The solid-state imaging device according to claim 6, further comprising:
   an insulating interlayer between said second filter component and said second photoelectric conversion portion;
   an inner-layer lens between said second filter component and said second photoelectric conversion portion.

17. A solid-state imaging device comprising:
   an optical inner filter between a first filter component of a filter layer and a first photoelectric conversion portion of a substrate, a side wall being on the optical inner filter,
   wherein first oblique light is transmissible through said first filter component and said optical inner filter, said side wall being configured to reflect said first oblique light onto said first photoelectric conversion portion,
   wherein second oblique light is transmissible through a second filter component of the filter layer, said side wall being configured to reflect said second oblique light onto a second photoelectric conversion portion of the substrate,
   the solid-state imaging device further comprising:
   an insulating interlayer between said second filter component and said second photoelectric conversion portion;
   an inner-layer lens between said second filter component and said second photoelectric conversion portion,
   wherein said insulating interlayer is between said second filter component and said inner-layer lens.

18. A solid-state imaging device comprising:
   an optical inner filter between a first filter component of a filter layer and a first photoelectric conversion portion of a substrate, a side wall being on the optical inner filter,
   wherein first oblique light is transmissible through said first filter component and said optical inner filter, said side wall being configured to reflect said first oblique light onto said first photoelectric conversion portion,
   wherein second oblique light is transmissible through a second filter component of the filter layer, said side wall being configured to reflect said second oblique light onto a second photoelectric conversion portion of the substrate,
   the solid-state imaging device further comprising:
   an insulating interlayer between said second filter component and said second photoelectric conversion portion;
   an inner-layer lens between said second filter component and said second photoelectric conversion portion,
   wherein said inner-layer lens is between said second filter component and said insulating interlayer.

19. The solid-state imaging device according to claim 16, wherein a wiring layer is in said insulating interlayer.

20. A camera module comprising:
   the solid-state imaging device according to claim 2;
   an optical lens system.

* * * * *